United States Patent
Tan et al.

[11] Patent Number: 6,140,168
[45] Date of Patent: Oct. 31, 2000

[54] METHOD OF FABRICATING SELF-ALIGNED CONTACT WINDOW

[75] Inventors: Wayne Tan, Taipei; Kun-Chi Lin, Hsinchu, both of Taiwan

[73] Assignee: United Microelectronics Corp., Hsinchu, Taiwan

[21] Appl. No.: 09/241,330

[22] Filed: Feb. 1, 1999

[51] Int. Cl.[7] .................................................. H01L 21/425
[52] U.S. Cl. ........................... 438/197; 438/696; 438/700; 438/514; 438/197; 438/743; 438/705
[58] Field of Search .................................. 438/694, 696, 438/700, 514, 197, 743, 705

[56] References Cited

U.S. PATENT DOCUMENTS

| | | | |
|---|---|---|---|
| 3,907,616 | 9/1975 | Wiemer | 148/188 |
| 4,358,889 | 11/1982 | Dickman et al. | 29/571 |
| 4,359,817 | 11/1982 | Dickman et al. | 29/571 |
| 4,554,728 | 11/1985 | Shepard | 29/576 |
| 4,686,000 | 8/1987 | Heath | 156/643 |
| 5,235,189 | 8/1993 | Hayden et al. | 257/329 |
| 5,648,291 | 7/1997 | Sung | 437/52 |
| 5,943,581 | 8/1999 | Lu et al. | 438/386 |

*Primary Examiner*—Benjamin L. Utech
*Assistant Examiner*—Vanessa Perez Ramos

[57] ABSTRACT

A method of fabricating a self-aligned contact window includes forming an undoped dielectric layer on a substrate having a least gate structure. The dopants are implanted into a pre-determined region of the undoped dielectric layer and the dielectric layer with the dopants is then removed. A self-aligned contact is therefore completed.

12 Claims, 2 Drawing Sheets

METHOD OF FABRICATING SELF-ALIGNED CONTACT WINDOW

BACKGROUND OF THE INVENTION

1. Field of the Invention

The invention relates to a method of fabricating an integrated circuit, and more particularly to a method of fabricating a self-aligned contact (SAC) window.

2. Description of the Related Art

As the dimensions of size approach 0.25 μm or less, the etching process for the contact becomes difficult due to the design rule and limitation of exposure light resolution. Therefore, a self-aligned contact process is developed. The principle of the self-aligned process is to use an etching recipe that is highly selective to two different dielectrics, such as silicon oxide and silicon nitride, during the etching process for the contact, so that the design rule can be relaxed.

Generally, the dielectrics covering the devices is silicon oxide so that silicon nitride is used as an etching stop for the self-aligned contact. Therefore, a recipe with high oxide but low silicon nitride etching rate has to be adjusted.

BPSG with a high dopant is used as a dielectrics and since it is flowable during thermal process, a planarized surface can be provided for the wafer having a device structure thereon. Accordingly, BPSG becomes the preferred planarization dielectrics. However, the BPSG having dopants such as phosphorus and boron inside leads to a higher etching rate than non-doped silicon oxide, which causes it to be easily eroded in a solution by wet etching. As a result, the features of BPSG, such as its highly doped state and easy reflow ability, often cause short circuits during the subsequent cleaning processes. Therefore, BPSC is not suitable as an inter-dielectric for complex and tight design rule IC products, such as DRAM devices.

SUMMARY OF THE INVENTION

It is therefore an object of the invention to provide a method of fabricating a self-aligned contact to prevent short circuits due to the reflow and high etching rate of BPSG.

To achieve these objects and advantages, and in accordance with the purpose of the invention, as embodied and broadly described herein, the invention is directed towards a method of fabricating a self-aligned contact. An undoped dielectric layer is formed over a substrate having at least a gate thereon. A photoresist is coated on the undoped dielectric layer and serves as a mask to perform an ion implantation on the undoped dielectric layer, so that the dielectric layer exposed by the photoresist layer is doped with dopant, such as phosphorus and boron. Then, the dielectric layer is patterned by the photoresist layer and a self-aligned contact window is formed within the dielectric layer to expose a portion of the substrate.

The region of the non-doped dielectric layer corresponding to formation of a SAC window is doped with dopant and accordingly the SAC process is easily performed. In addition, the other region of the dielectric layer is still undoped which is beneficial to subsequent cleaning process. The dielectric layer can be protected from being damaged by a wet etching solution and therefore the quality of the dielectric layer can be enhanced.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The etching process for the contact window is used to etch the dielectric layer over the source/drain region of MOS transistor in order to achieve the electrical connection between the source/drain region and the metal layer. The self-aligned contact process has some advantages including no restrictions regarding the exposure light resolution and no additional processes. Therefore, it is widely used in submicron ULSI fabrication.

The self-aligned contact is formed by using different etching rates to two materials of the spacer and the cap layer, respectively, beside and on the gate and the dielectric layer to perform the etching process. Since the recipe of the etchant has a higher etching rate for the silicon oxide layer serving as a dielectric layer than for the silicon nitride layer used for the spacer and the cap layer, the etching rate of the spacer and the cap layer can be ignored and the etching process stops on the spacer and the cap layer. The dielectric layer is etched through to expose the substrate and the self-aligned process is completed. Accordingly, the formation of the spacer and the cap layer in the SAC process is able to protect the gate from being etched when the dielectric layer is etched. The width of the contact is not limited by photolithography and it does not require additional masks. Therefore, the process is not complex and the fabricated cost does not increase.

In order to use an etching recipe with a higher selectivity between the dielectric layer, the spacer and the cap layer, a doped BSPG serving as a dielectric layer is used to cover the MOS transistor. However, both the big loss from wet etching and the easy reflow cause a poor quality BPSG and as a result, short circuits occur.

To avoid these problems, the BPSG in the prior art is substituted for by the undoped silicon oxide serving as a dielectric layer in this invention. Since the etching rate of the undoped silicon oxide layer is slower than that of the BPSG, the etching process becomes more difficult. Consequently, an ion implantation process is performed on the exposed undoped dielectric layer when the dielectric layer is patterned by a photoresist layer. Therefore, the exposed undoped dielectric layer become doped and can be smoothly etched through, as shown in FIGS. 1A–1D, which illustrate the fabricated process of the self-aligned contact window.

Figure 1A:
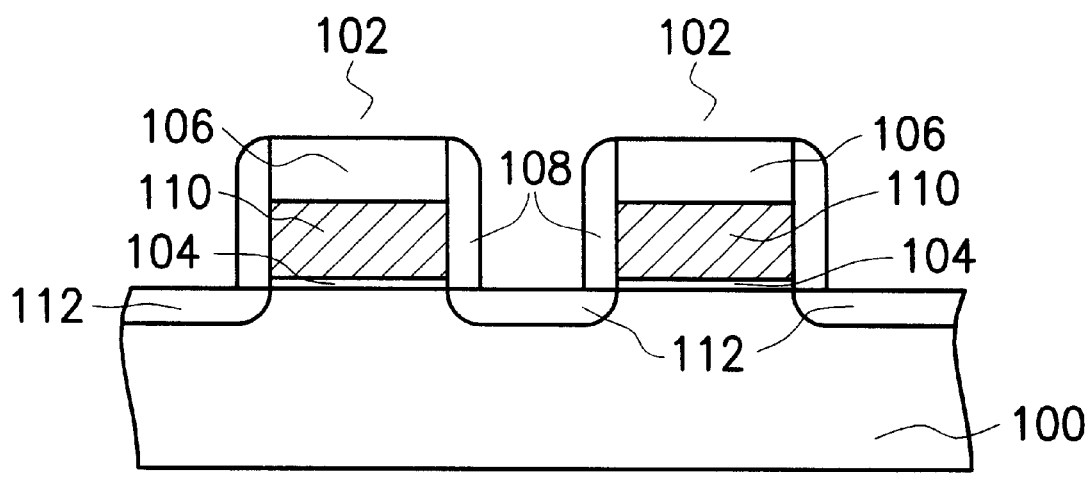
FIGS. 1A–1D are schematic, cross-sectional views illustrating of fabrication of a self-aligned contact window in a preferred embodiment according to the invention.

Referring to FIG. 1A, a gate structure 102 including a gate oxide layer 104, a cap layer 106, a spacer 108 and a gate 110 are formed on a substrate 100. The gate oxide layer 104 is used to isolate the substrate 100 and the gate 110, and the spacer 108 and the cap layer 106 are used to protect the gate 110 from being damaged by a subsequent etching process. The gate oxide layer 104 having a thickness of about 30–150 Å is formed by thermally oxidizing the substrate 100. A conductive layer and the cap layer 106 are successively formed on the gate oxide layer 104 and then patterned by photolithography to form the gate 102 and the cap layer 106. The cap layer 106 is made from a material such as silicon nitride and the material of the gate 110 can be polysilicon or polycide.

The spacer 108 is formed from a material such as silicon nitride after the formation of the gate 110. A silicon nitride layer is deposited over the substrate 100 and etched back using the substrate 100 as an etching stop to form a nitride spacer on the sidewall of the gate 110 and the cap layer 106. A source/drain region 112 is formed by ion implantation on the substrate 100 beside the gate structure 102, as shown in FIG. 1A.

Figure 1B:
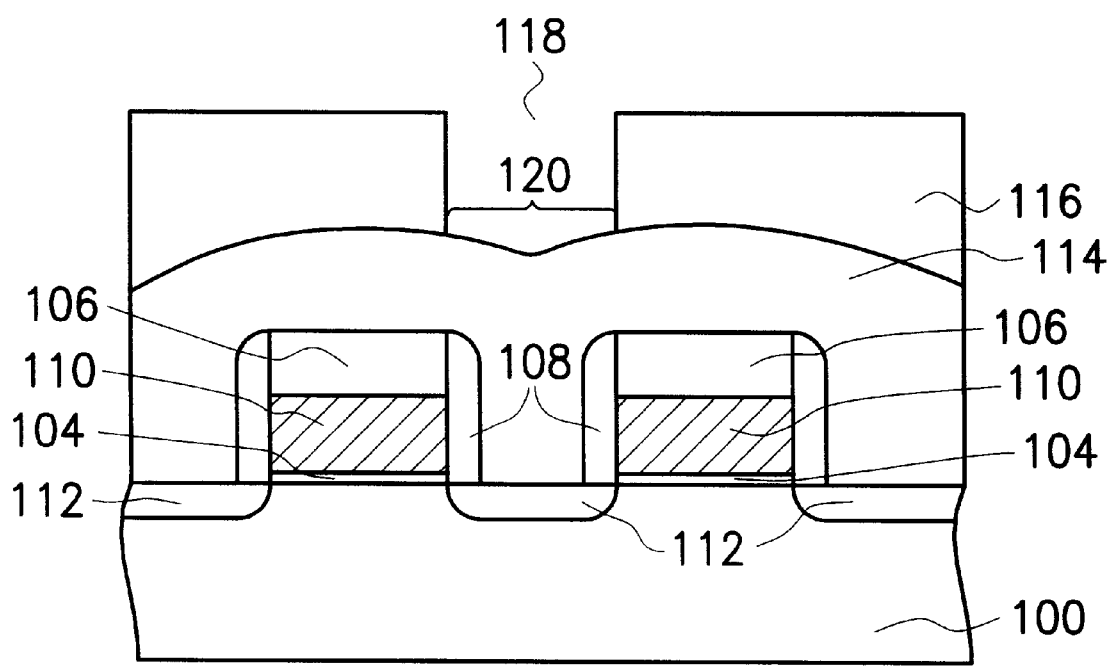

Referring, to FIG. 1B, an undoped dielectric layer is formed over the substrate 100 to cover the gate structure 102 and the substrate 100. The undoped dielectric layer 114 can be a TEOS oxide layer with a thickness of about 5000 Å, which is formed by low pressure chemical vapor deposition (LPCVD), for example. A photoresist layer 116 is formed on the dielectric layer 114 and then exposed and developed to form an opening 118 therein to expose a portion of the dielectric layer 114. A pre-determined region 120 for formation of a self-aligned contact is defined by the photoresist layer 116.

Figure 1C:
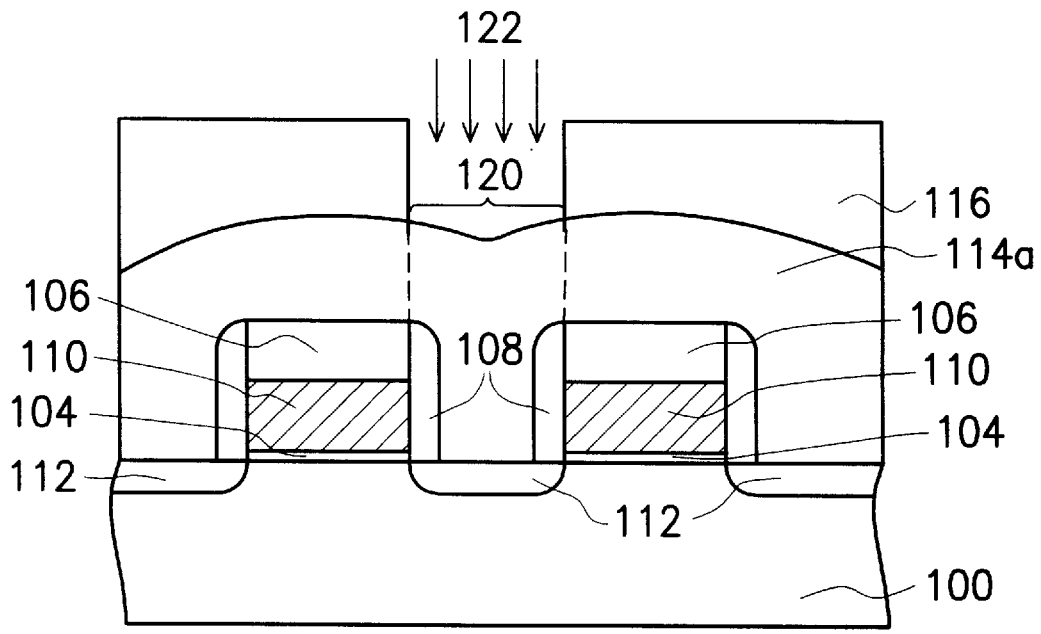

Referring to FIG. 1C, using the photoresist layer 116 as a mask, ions 122 such as phosphorus and boron are implanted into the undoped dielectric layer 114. The energy and the dosage of the ion implantation 122 are varied according to the thickness of the undoped dielectric layer 114. If, for example, the undoped dielectric layer 114 is about 5000 Å thick, then the ion implantation 122 is performed at energy of about 600–700 KeV, corresponding to a dosage of about $10^{13}$–$10^{14}$ ions/cm$^2$. Therefore, the exposed undoped dielectric layer 114 is doped with ions and the pre-determined region 120 of the dielectric layer 114a becomes doped. Since the ion implantation 122 is performed at a high level of energy leading a portion of the vacancy of the silicon oxide being occupied by the phosphorus atoms and boron atoms, such that the structure of the pre-determined region 120 is more fragile than the undoped silicon oxide layer. Therefore, the subsequent etching process can be easily performed.

Figure 1D:
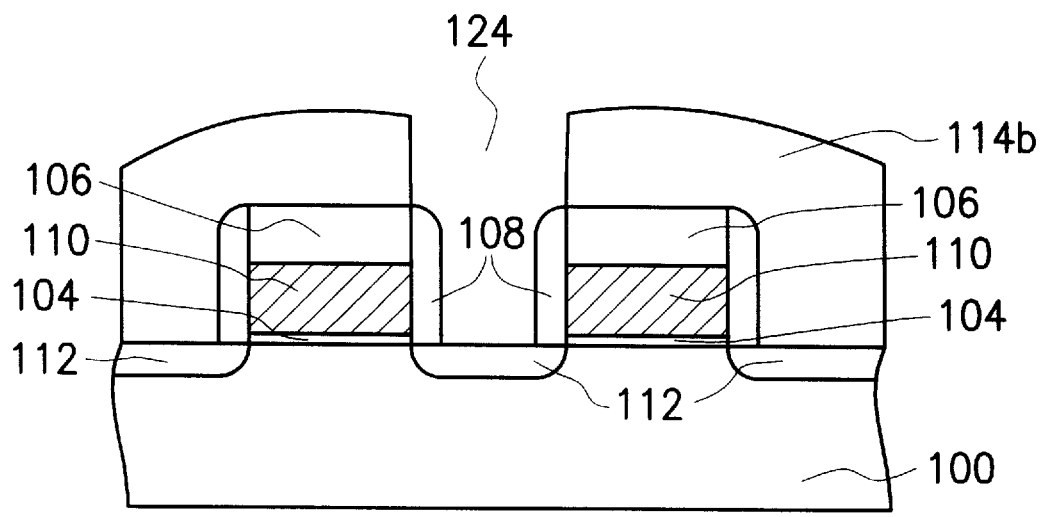

Referring to FIG. 1D, the dielectric layer 114a is then patterned by the photoresist layer 116. As a result, the pre-determined region 120 with dopants is removed by plasma using a mixture of reactive etching gases. A suitable mixture of etching gases may consist of methyl trifluoride (CHF$_3$), carbon tetrafluoride (CF$_4$) and argon (Ar). The dielectric layer 114a in FIG. 1C is etched away to form a self-aligned contact window 124, by which the spacer 108 and the source/drain region 112 are exposed. The pre-determined region 120 exposed by the photoresist layer 116 is doped and the gate 110 is covered with silicon nitride for the spacer 108 and the cap layer 106, so that the etching process for the self-aligned contact window 124 can be smoothly performed due to the etching selectivities of the dielectric layer 114a, the cap layer 106 and the spacer 108. The other portion of the dielectric layer 114b is still undoped, such that the dielectric layer 114b has better ability to prevent loss due to the wet etching. Then, the photoresist layer 116 is removed.

This invention is used on an undoped oxide layer serving as a dielectric layer to cover the gate; thus, the shorts, which are caused by the highly integrated device region being covered with a BPSG, can be avoided. But it is difficult to etch the undoped oxide layer; therefore, the pre-determined region for the self-aligned contact is doped with dopants and then the etching process can be easily performed. As a result, this invention not only solves the problems in the prior art, but also the formation of the self-aligned contact window is not restricted by the design rule.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a self-aligned contact window, wherein a substrate having at least a conductive structure thereon is provided, the method comprising:

forming an undoped dielectric layer over the substrate;

transforming only a portion of the undoped dielectric layer into a doped dielectric layer, wherein the portion is aligned over the conductive structure; and removing the doped dielectric layer to form a self-aligned contact window within the undoped dielectric layer that exposes the conductive structure.

2. The method according to claim 1, wherein the portion of the undoped dielectric layer aligned over the conductive structure is delineated by a photoresist.

3. The method according to claim 1, wherein the dielectric layer includes silicon oxide.

4. The method according to claim 1, wherein the portion of the undoped dielectric layer is transformed using ion implantation with dopant that includes phosphorus and boron.

5. The method according to claim 1, wherein the the doped dielectric layer is removed by plasma etching.

6. A method of fabricating a self-aligned contact window, wherein a substrate having at least a gate structure or a source/drain region is provided, the method comprising the steps of:

forming an undoped dielectric layer over the substrate;

implanting dopant into a portion of the undoped dielectric layer, the portion of the dielectric layer being aligned over the gate structure or the source/drain region; and performing an etching process on the portion implanted with dopant with a selectivity that an etchings ratio of the remaining undoped dielectric layer is negligible compared to an etching ratio of the implanted portion until the gate structure or the source/drain region is exposed.

7. The method according to claim 6, wherein the dielectric layer includes silicon oxide layer.

8. The method according to claim 6, wherein the dopant is selected from the group consisting of phosphorus and boron.

9. A method of fabricating a self-aligned window to expose a conductive structure on a substrate, the method comprising:

forming an undoped dielectric layer on the substrate, the undoped dielectric layer covering the conductive structure;

forming a photoresist layer on the undoped dielectric layer, the photoresist layer exposing a portion of the undoped dielectric layer that is to be removed to form the self-aligned contact window subsequently;

performing an ion implantation on the undoped dielectric layer with the photoresist layer as a mask, so that the exposed portion of the undoped dielectric layer is transformed into a doped dielectric layer with an etching ratio different from that of the undoped dielectric layer;

performing a plasma etching step with a selectivity that an etching ratio of the undoped dielectric layer covered by the photoresist layer is negligible compared to an etching ratio of the doped dielectric layer until the conductive structure is exposed; and removing the photoresist layer.

10. The method according to claim 1, wherein the doped dielectric layer is removed by a mixture of etching gases comprising methyl trifluoride, carbon tetrafluoride and argon.

11. The method according to claim 6, wherein an etchant used in the etching process comprises a mixture of etching gases comprising methyl trifluoride, carbon tetrafluoride and argon.

12. The method according to claim 9, wherein the plasma etching step uses a mixture of etching gases comprising methyl trifluoride, carbon tetrafluoride and argon.

* * * * *